United States Patent
Rao et al.

(10) Patent No.: US 9,766,278 B2
(45) Date of Patent: Sep. 19, 2017

(54) THREE PHASE POWER QUALITY MEASUREMENT USING ASYNCHRONOUS, ISOLATED SINGLE PHASE CIRCUITS

(71) Applicant: Cirrus Logic, Inc., Austin, TX (US)

(72) Inventors: Bala Vishnu Shankar Rao, Austin, TX (US); Roderick D. Holley, II, Spicewood, TX (US)

(73) Assignee: Cirrus Logic, Inc., Austin, TX (US)

( * ) Notice: Subject to any disclaimer, the term of this patent is extended or adjusted under 35 U.S.C. 154(b) by 796 days.

(21) Appl. No.: 13/739,909

(22) Filed: Jan. 11, 2013

(65) Prior Publication Data

US 2013/0197839 A1 Aug. 1, 2013

Related U.S. Application Data

(60) Provisional application No. 61/585,970, filed on Jan. 12, 2012.

(51) Int. Cl.
*G01R 25/00* (2006.01)
*G01R 27/00* (2006.01)
*G01R 29/18* (2006.01)

(52) U.S. Cl.
CPC ............ *G01R 25/00* (2013.01); *G01R 29/18* (2013.01)

(58) Field of Classification Search
CPC ................................ G01R 25/00; G01R 29/18
USPC ......................................................... 702/65
See application file for complete search history.

(56) References Cited

U.S. PATENT DOCUMENTS

| 5,555,182 A | 9/1996 | Galm | |
|---|---|---|---|
| 6,172,533 B1* | 1/2001 | Fransson | G01R 23/02 327/12 |
| 6,954,704 B2* | 10/2005 | Minami | H02H 1/0061 700/292 |
| 2007/0247139 A1* | 10/2007 | Veroni | G01R 29/18 324/84 |

(Continued)

OTHER PUBLICATIONS

Bonanomi, P. Phase-Angle Measurements with Synchronized Clocks—Principle and Applications, IEEE Transactions on Power Apparatus and Systems, Dec. 12, 1981, pp. 1-8, Vol. PAS-100, Borwn, Boveri & Co., Ltd., Baden, Switzerland.

(Continued)

*Primary Examiner* — Stephanie Bloss
(74) *Attorney, Agent, or Firm* — Terrile, Cannatti, Chambers & Holland, LLP; Kent B. Chambers

(57) ABSTRACT

A system and method utilize multiple, asynchronous, voltage isolated integrated power data circuits (IPDCs) to respectively determine one or more power parameters of a multi-phase power distribution system. In at least one embodiment, the power parameters represent differences between voltage phases of a multi-phase power distribution system. In at least one embodiment, the IPDCs each sense a voltage or current from a single phase of a three-phase power distribution system. Additionally, the IPDCs are electrically isolated from each other and, thus, in at least one embodiment, can utilize voltage divider or shunt resistor sensing without being subject to high voltages representative of the difference between voltage phases. Additionally, in at least one embodiment, each of the IPDCs utilizes a separate clock signal to determine phase sequence and phase angle deltas of one or more three phase voltages of the three-phase power distribution system.

21 Claims, 15 Drawing Sheets

(56) References Cited

U.S. PATENT DOCUMENTS

2010/0161263 A1* 6/2010 Benmouyal ........ G01R 19/2513
702/72

OTHER PUBLICATIONS

Micheletti, R., Phase Angle Measurement Between Two Sinusoidal Signals, IEEE Transactions on Instrumentation and Measurement, Feb. 1991, pp. 40-42, vol. 40, No. 1.
Xia, Tao and Yilu Liu, Single-Phase Phase Angle Measurements in Electric Power Systems, IEEE Transactions on Power Systems, May 2010, pp. 844-852, vol. 25, No. 2.
International Search Report and Written Opinion of the International Searching Authority dated May 7, 2013, issued in the corresponding PCT Application No. PCT/US13/21303, 9 pages.
Response to the Written Opinion as filed Apr. 7, 2015, Application No. 13701889.1, European Patent Office, pp. 1-14.
Subbarao, Wunnava V., et al., Digital Measurement of Phase Angles for Fault Tolerant Systems, Southeastcon '93, Proceedings, Apr. 4-7, 1993, pp. 1-8, IEEE.

* cited by examiner

THREE PHASE POWER QUALITY MEASUREMENT USING ASYNCHRONOUS, ISOLATED SINGLE PHASE CIRCUITS

CROSS-REFERENCE TO RELATED APPLICATION

This application claims the benefit under 35 U.S.C. §119(e) and 37 C.F.R. §1.78 of U.S. Provisional Application No. 61/585,970, filed Jan. 12, 2012, and entitled "Cost Effective Phase Sequence Detection and Accurate Phase Angle Measurement in 3-Phase Systems", which is incorporated by reference in its entirety.

BACKGROUND OF THE INVENTION

Field of the Invention

The present invention relates in general to the field of electronics, and more specifically to a system and method for three phase power quality measurement using asynchronous, isolated single phase circuits Description of the Related Art Utility companies and other companies provide electrical power to many customers. The particular loads that utilize the electrical power can affect the quality of the delivered power. Accordingly, many entities utilize power measuring systems to measure characteristics of the power delivered to one or more loads.

FIG. 1 depicts a power distribution system 100 that includes a power measurement system 102 that measures various characteristics of the three phase power delivered to the loads 104, 106, and 108. Loads 104, 106, and 108 can be any type of load including resistive, reactive, or resistive and reactive. The power distribution system 100 includes a phase A voltage $V_A$, a phase B voltage $V_B$, a phase C voltage $V_C$, and a neutral conductor N. FIG. 2 depicts ideal waveforms 200 representing the phase A voltage $V_A$, the phase B voltage $V_B$, the phase C voltage $V_C$. In at least one embodiment, the voltages $V_A$, $V_B$, and $V_C$ have a nominal fundamental line frequency of 60 Hz and a nominal root mean square (RMS) voltage of 110V in the United States of America and a nominal 50 Hz and a nominal RMS voltage of 220V in Europe.

Referring to FIGS. 1 and 2, in at least one embodiment, the A, B, and C phases and the neutral N are connected in a well-known wye configuration. In at least one embodiment, when the phases are connected in a delta configuration, the neutral N is omitted. Ideally the phase A voltage $V_A$, the phase B voltage $V_B$, and the phase C voltage $V_C$ have phases that are exactly 120° apart. However, the loads 104, 106, and 108 can cause the phase relationships to vary. Variation of the phase relationships can damage one or more of the loads 104, 106, and 108.

To determine the phase relationships, the power measurement system 102 includes a monolithic phase sequence and phase angle detector integrated circuit (IC) 110. The monolithic IC senses the voltages $V_A$, $V_B$, and $V_C$ on respective channels 112, 114, and 116 via voltage dividers 118, 120, and 122 and utilizes a single, high frequency clock signal CLK_HF. The high frequency clock signal CLK_HF provides a synchronous clock signal that allows the monolithic IC 110 to coordinate sampling of the voltages $V_A$, $V_B$, and $V_C$, to determine the phase sequence and phase angle relationships between the voltages $V_A$, $V_B$, and $V_C$. An exemplary frequency of the high frequency clock signal CLK_HF is 4 MHz. The monolithic IC provides the phase sequence and phase angle relationships in the respective signals PHASE_SEQ and PHASE_ANGLES for display, transmission, or storage in a memory for subsequent access.

However, implementation of a high frequency clock signal CLK_HF implies more sophisticated hardware in the monolithic IC 102 and increased power consumption than a slower determination of the phase sequence and phase angle relationships between the voltages $V_A$, $V_B$, and $V_C$. Additionally, in at least one embodiment, because the voltage channels 112, 114, and 116 are not isolated in the monolithic IC 102, utilizing shunt resistor sensing of currents related to the voltages $V_A$, $V_B$, and $V_C$ is impractical.

SUMMARY OF THE INVENTION

In one embodiment of the present invention, a method includes initiating concurrent data acquisition by multiple integrated power data circuits to obtain respective data for respective voltages of a three-phase power distribution system to determine one or more power parameters for the voltages in the three-phase voltage distribution system The method further includes providing the data to a processor and determining the one or more power parameters with the processor. The method also includes providing access to the determined power parameters.

In another embodiment of the present invention, an apparatus includes a power measurement system. The power measurement system is configured to initiate concurrent data acquisition by multiple integrated power data circuits to obtain respective data for respective voltages of a three-phase power distribution system to determine one or more power parameters for the voltages in the three-phase voltage distribution system. The power measurement system is further configured to provide the data to a processor and determine the one or more power parameters with the processor. The power measurement system is also configured to provide access to the determined power parameters.

In a further embodiment of the present invention, a power measurement system includes means for initiating concurrent data acquisition by multiple integrated power data circuits to obtain respective data for respective voltages of a three-phase power distribution system to determine one or more power parameters for the voltages in the three-phase voltage distribution system. The power measurement system further includes means for providing the data to a processor and means for determining the one or more power parameters with the processor. The power measurement system further includes means for providing access to the determined power parameters.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A system and method utilize multiple, asynchronous, voltage isolated integrated power data circuits (IPDCs) to respectively determine one or more power parameters of a multi-phase power distribution system. In at least one embodiment, the power parameters represent differences between voltage phases of a multi-phase power distribution system. In at least one embodiment, the IPDCs each sense a voltage or current from a single phase of a three-phase power distribution system. Additionally, the IPDCs are electrically isolated from each other because, for example, the IPDCs include respective input channels that receive respective, isolated input voltages, and, thus, in at least one embodiment, can utilize low cost (relative to conventional three-phased monolithic integrated circuit based systems) voltage divider or shunt resistor sensing without being subject to high voltages representative of the difference between voltage phases. Additionally, in at least one embodiment, each of the IPDCs utilizes a separate clock signal to determine phase sequence and phase angle deltas of one or more three phase voltages of the three-phase power distribution system. A phase angle "delta" represents a difference between phases of two signals, such as the difference between a phase of a first voltage and a phase of a second voltage. The clock signal of each IPDC is asynchronous to the clock signals of the other ICs. The power measurement system utilizes a common start command to initiate power parameter data acquisition and a phase sequence and phase angle detection process to determine and/or provide highly accurate data for phase sequence detection and phase angle detection despite the asynchronous clock signals. In at least one embodiment, the power measurement system has a phase angle accuracy with a typical 0.1 degree or better relative phase angle accuracy.

In at least one embodiment, utilizing multiple, asynchronous, voltage isolated IPDCs to determine one or more power parameters in a multi-phase power distribution system reduces system complexity and allows utilization of smaller and cheaper, single phase power measurement ICs. Furthermore, in at least one embodiment, the IPDCs detect the one or more power parameters with a relatively low frequency sampling, such as approximately 4 kHz, which reduces hardware costs and chip area for the ICs. Furthermore, in at least one embodiment, the power measurement system achieves approximately 0.1 degree phase accuracy without clock synchronization between the IPDCs and no isolation circuitry between the ICs.

Figure 1:
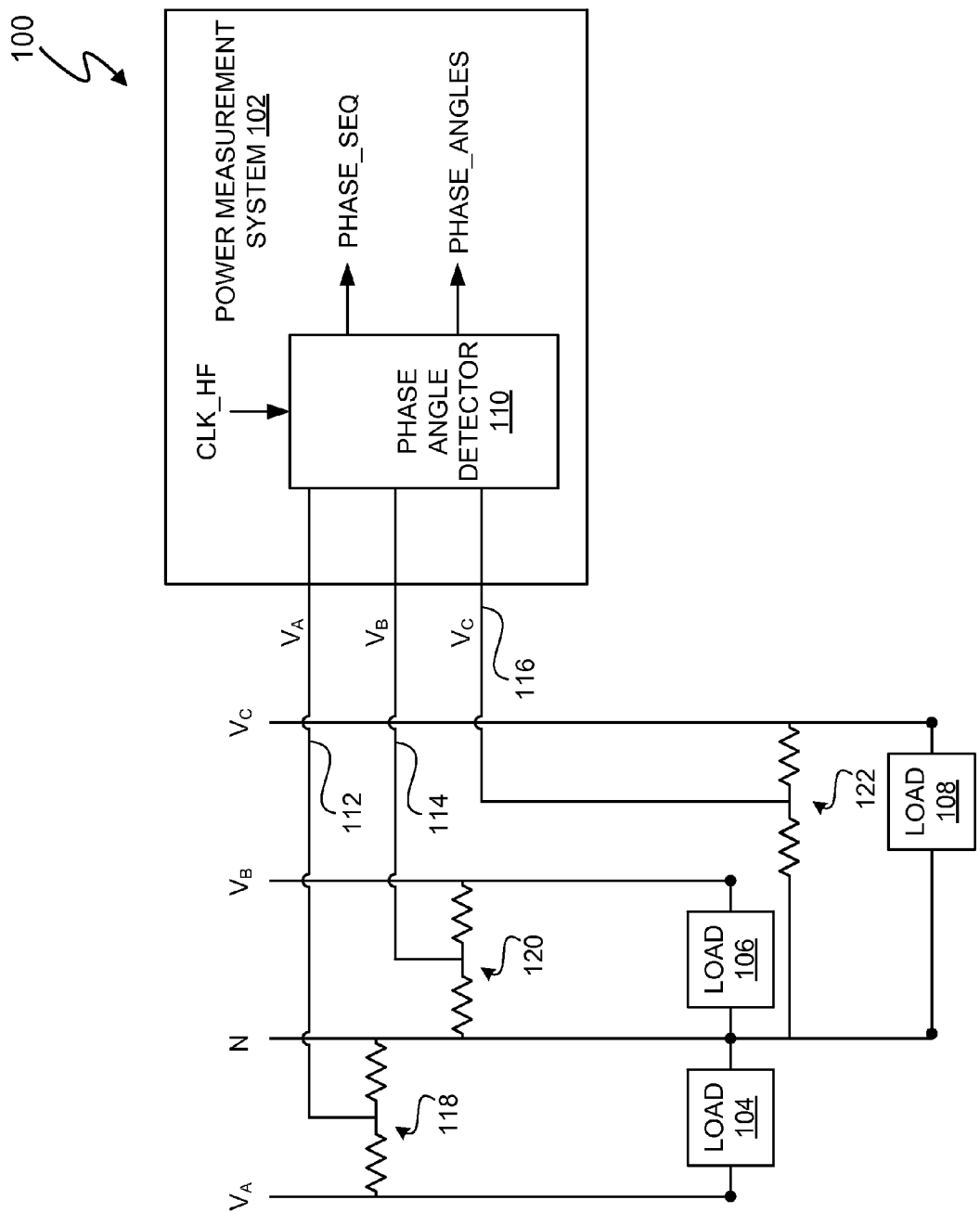
FIG. 1 (labeled prior art) depicts a power distribution system that includes a power measurement system that measures various characteristics of the three phase power.
Figure 2:
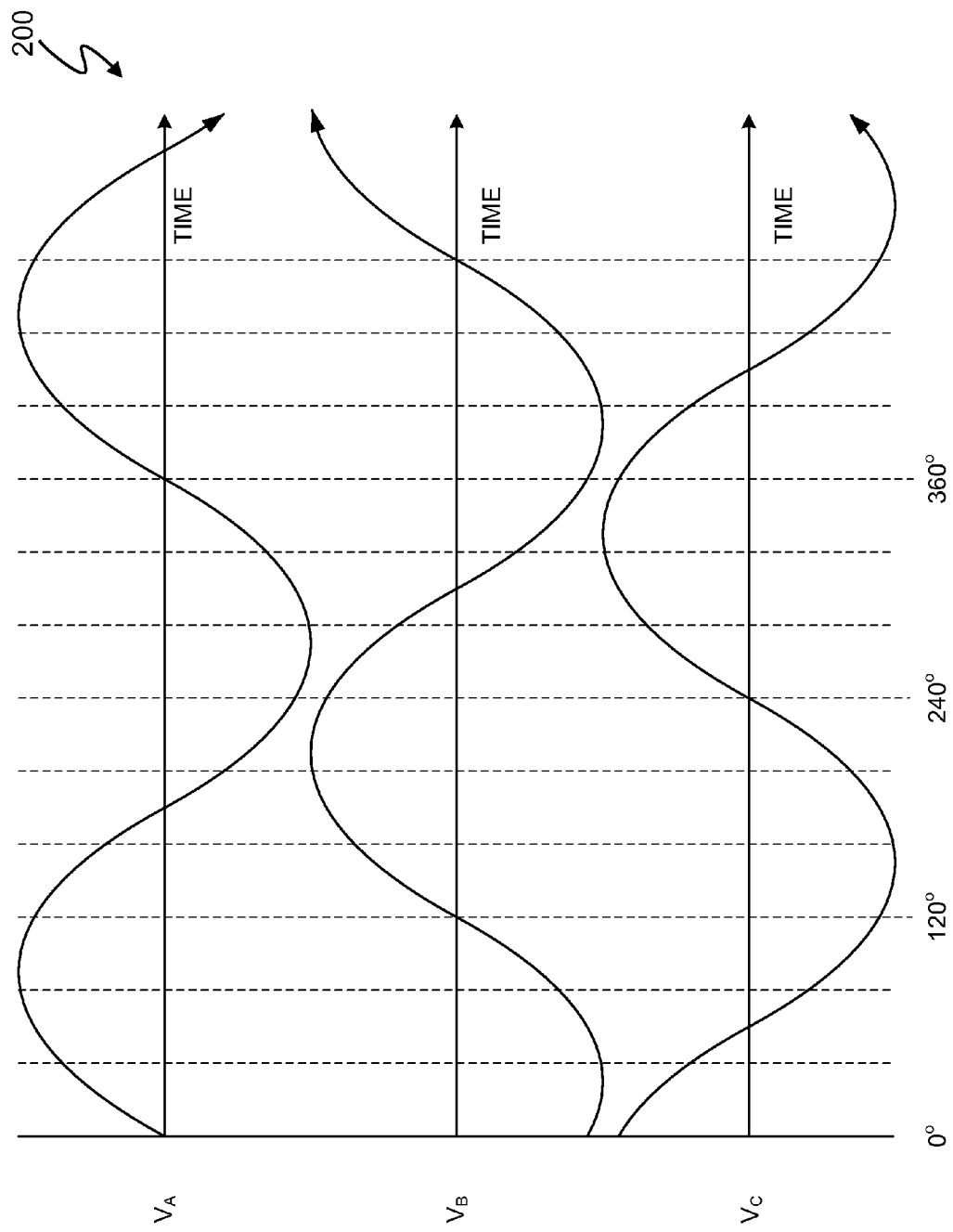
FIG. 2 (labeled prior art) depicts ideal, three-phase voltage waveforms.
Figure 3:
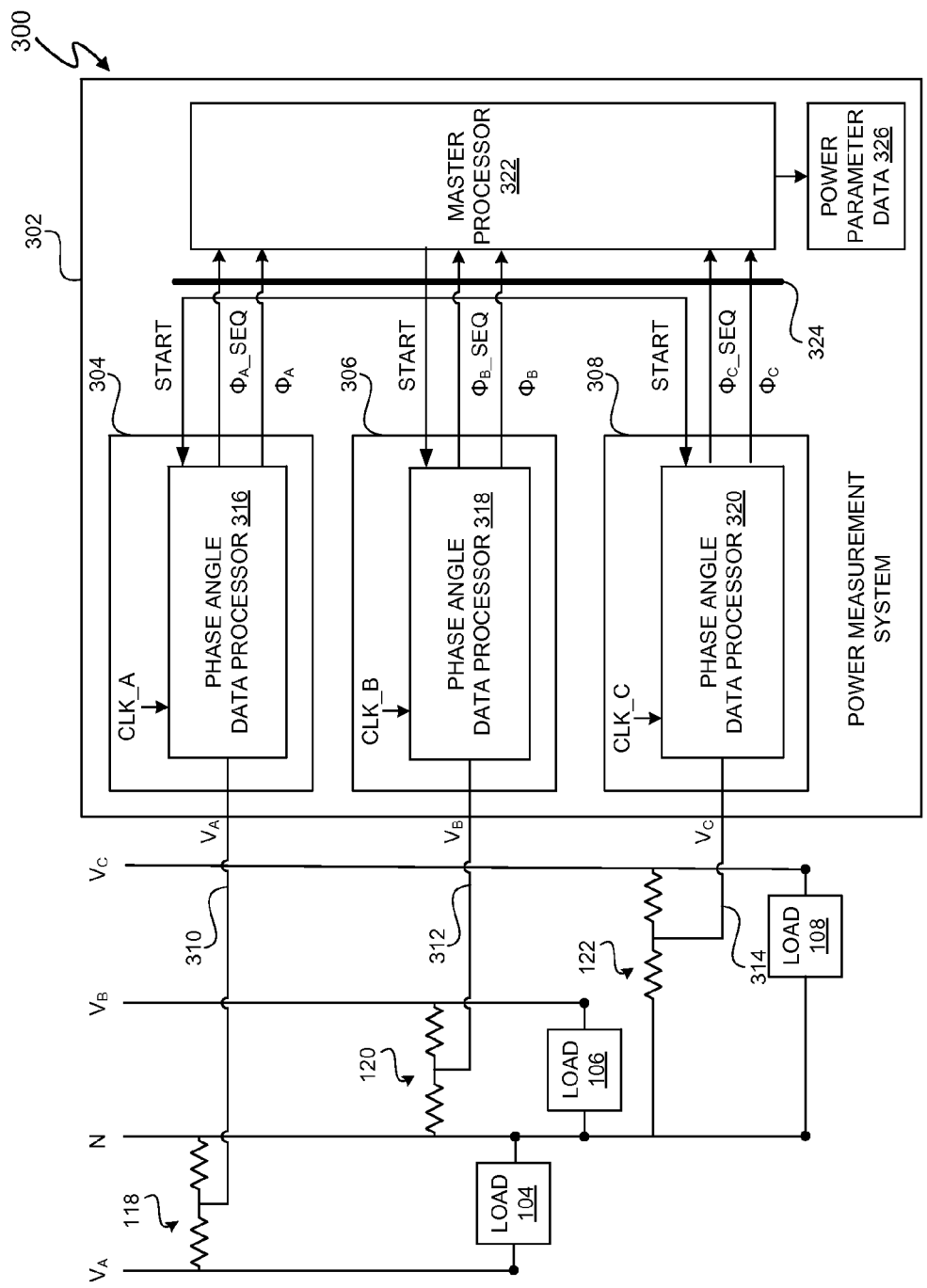
FIG. 3 depicts an embodiment of a power distribution system having a power measurement system with isolated, asynchronous clocked integrated power data circuits for processing power parameters from a three-phase power distribution system.
Figure 4:
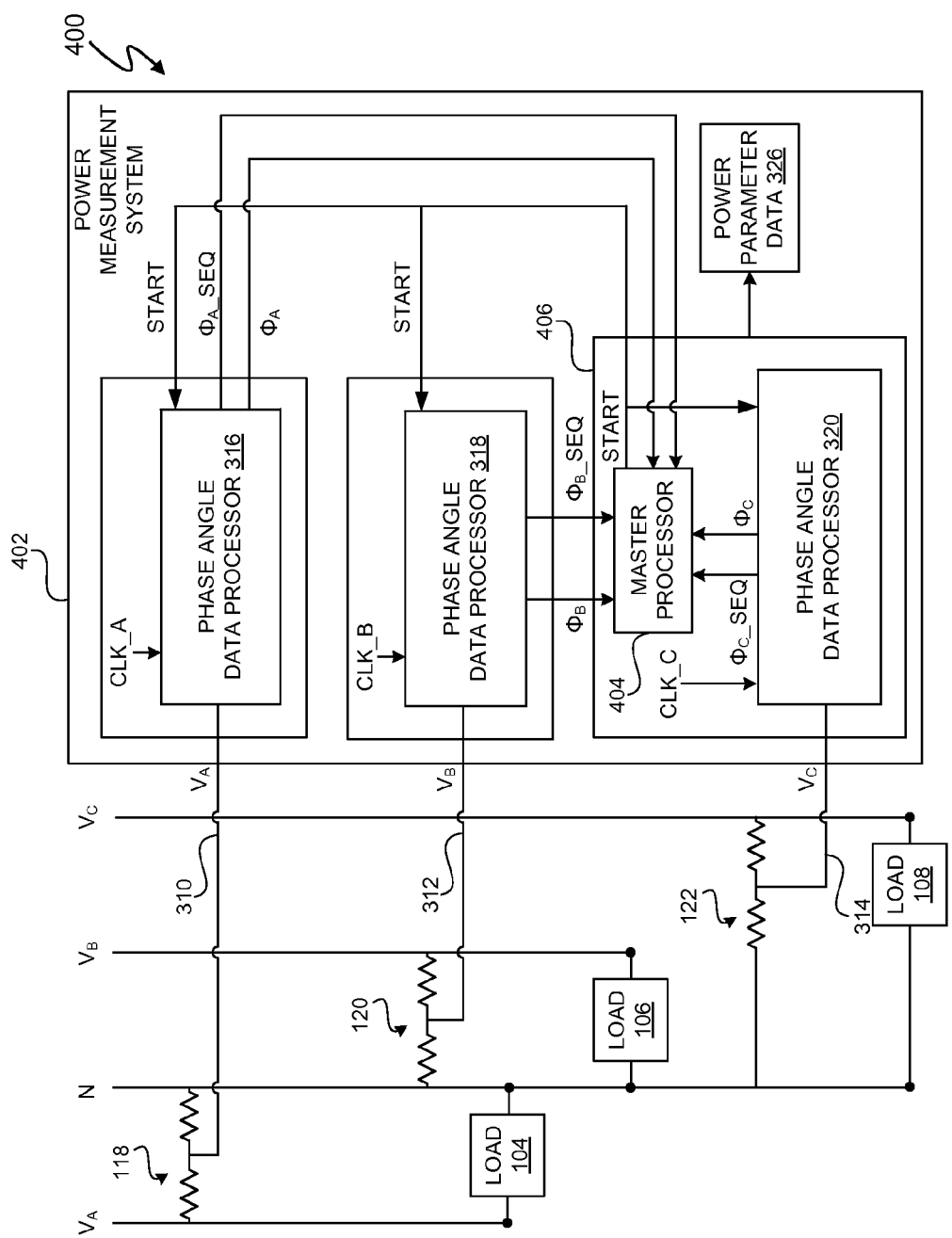
FIG. 4 depicts another embodiment of a power distribution system having a power measurement system with isolated, asynchronous clocked integrated power data circuits for processing power parameters from a three-phase power distribution system.

FIG. 3 depicts a three phase power distribution system 300 that includes a multi-IC power measurement system 302. The IPDCs 304, 306, and 308 respectively sense the phase A voltage $V_A$, the phase B voltage $V_B$, and the phase C voltage $V_C$ via respective channels 310, 312, and 314. In the embodiment of FIG. 3 and FIG. 4, the voltages $V_A$, $V_B$, and $V_C$ are configured in a wye configuration with a neutral line N. The subsequently described system and processes are equally applicable to other connection configurations, such as a delta connection configuration or mixed delta-wye connection configuration. In at least one embodiment, the power measurement system 302 is a fixed or portable power meter.

Each of the IPDCs 304, 306, and 308 includes a separate, respective clock signal CLK_A, CLK_B, and CLK_C. The IPDCs 304, 306, and 308 are electrically isolated from each other because, for example, the respective input channels 310, 312, and 314 receive respective, isolated input voltages $V_A$, $V_B$, and $V_C$, and, thus, the clock signals are asynchronous with respective each other. Each of the IPDCs 304, 306, and 308 includes a respective phase angle data processor 316, 318, and 320 to obtain the data for determination of the respective phase sequences and relative phase angles of the voltages $V_A$, $V_B$, and $V_C$. A master processor 322 is electrically isolated from the IPDCs 304, 306, and 308 via an isolation path 324. The design of the isolation path 324 is a matter of choice and, for example, includes optical isolation circuits (not shown) to provide electrical isolation.

The master processor 322 concurrently initiates concurrent data acquisition by the IPDCs 304, 306, and 308 to obtain respective data for respective voltages of the three-phase power distribution system 300 to determine one or more power parameters for the voltages in the three-phase voltage system. To initiate the concurrent data acquisition, the master processor 322 provides a START command data to each of the IPDCs 304, 306, and 308. The IPDCs 304, 306, and 308 begin concurrent data acquisition of respective sensed voltages $V_A$, $V_B$, and $V_C$. In at least one embodiment, the IPDCs 304, 306, and 308 sense the voltages $V_A$, $V_B$, and $V_C$ via respective voltage dividers 118, 120, and 122 and provide respective phase sequence signals $\phi_{A\_SEQ}$, $\phi_{B\_SEQ}$, and $\phi_{C\_SEQ}$ to the master processor 322. The phase sequence signals $\phi_{A\_SEQ}$, $\phi_{B\_SEQ}$, and $\phi_{C\_SEQ}$ represent data that allows the master processor 322 to determine the phase sequence of the respective voltages $V_A$, $V_B$, and $V_C$. The respective phase angle data processor 316, 318, and 320 also provide respective phase angle data $\phi_A$, $\phi_B$, and $\phi_C$ from the sensed voltages $V_A$, $V_B$, and $V_C$. As subsequently described in more detail, the master processor 322 receives and utilizes the phase sequence signals $\phi_{A\_SEQ}$, $\phi_{B\_SEQ}$, and $\phi_{C\_SEQ}$ and phase angle data $\phi_A$, $\phi_B$, and $\phi_C$ to determine the relative phase sequences and phase angles of the voltage $V_A$, $V_B$, and $V_C$. The master processor 322 then makes the power parameter data 326 available for transmission, display, and/or subsequent access from a memory (not shown).

FIG. 4 depicts a three phase power distribution system 400. The three phase power distribution system 400 includes a multi-IC power measurement system 402 that is identical to the power measurement system 302 except that the functions described for the master processor 322 are incorporated into the master processor 404 of the IPDC 406. In at least one embodiment, including the master processor 404 in the IPDC 406 eliminates the master processor 322 from the power measurement system 400. In at least one embodiment, the power measurement system 302 (FIGS. 3) and 402 include memory, a transmitter, and/or a display (not shown) to make the power parameter data 326 available for machine and/or human access.

Figure 5:
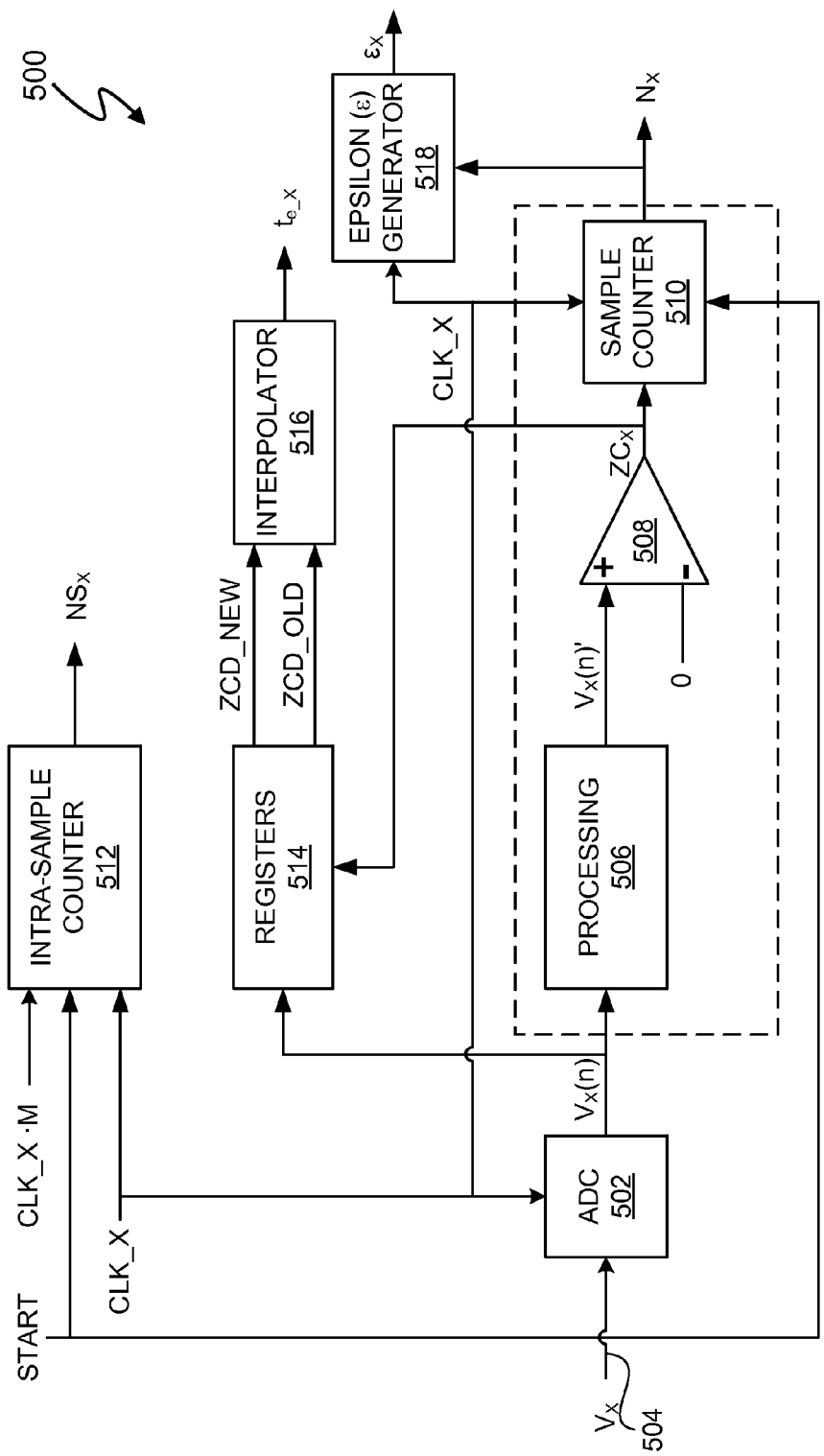
FIG. 5 depicts an embodiment of a phase angle data processor.

FIG. 5 depicts an exemplary phase angle data processor 500. The phase angle data processor 500 is an embodiment of each of the phase angle data processors 316, 318, and 320. The general principle of the phase angle data processor 500 is to determine an accurate measure of time between the START command and a common event among the three voltage phases $V_A$, $V_B$, and $V_C$. The particular common event is a matter of design choice. In at least one embodiment, the common event is a zero crossing of each of the voltage phases during a positive-to-negative transition or a negative-to-positive transition. To determine the accurate measure of time between the START command and the common event, the phase angle data processor 500 determines several values, as, for example, described below, that are utilized by a master processor to determine phase angle deltas in a three-phase voltage distribution system.

Figure 6:
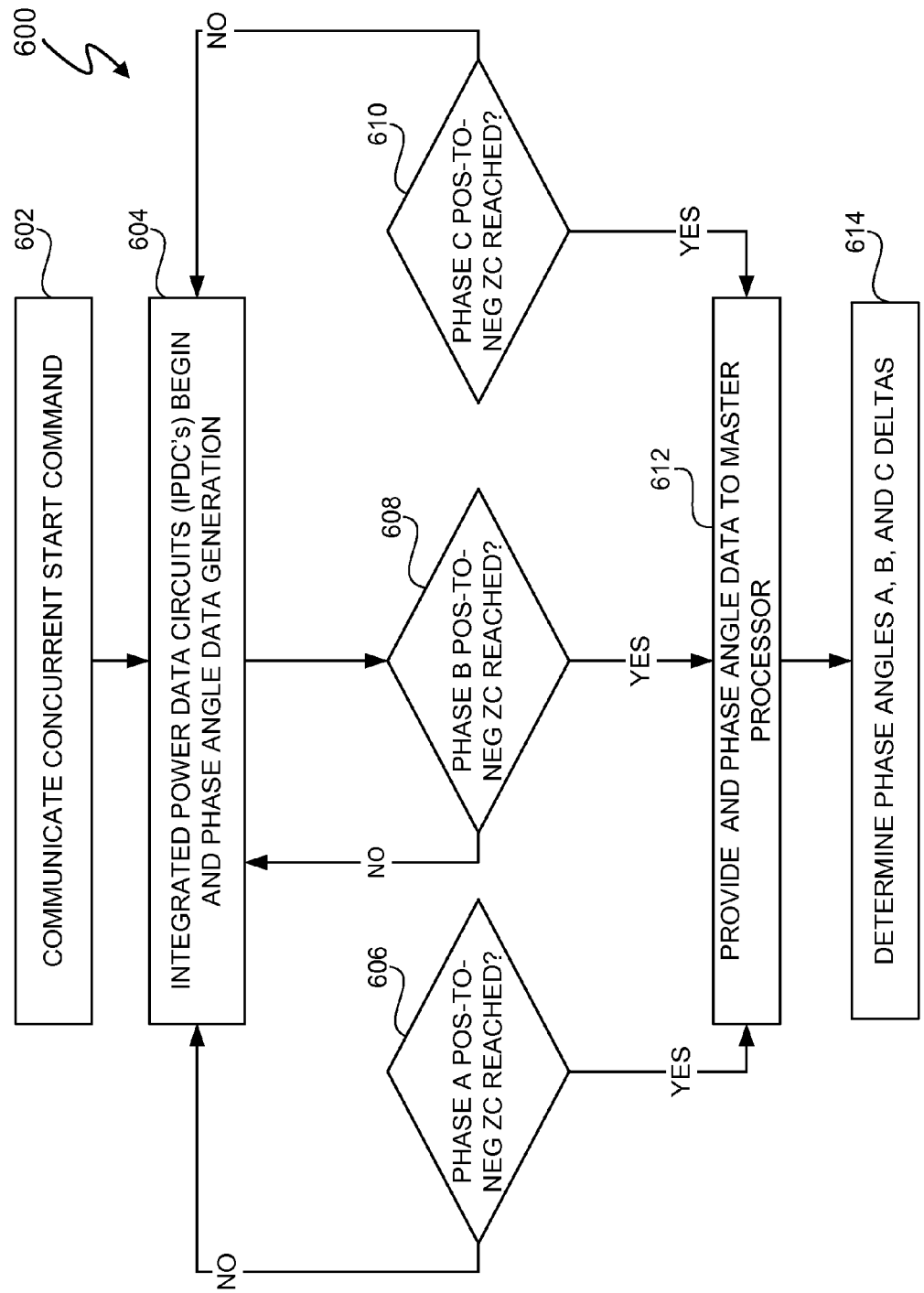
FIG. 6 depicts a phase angle data process.
Figure 7:
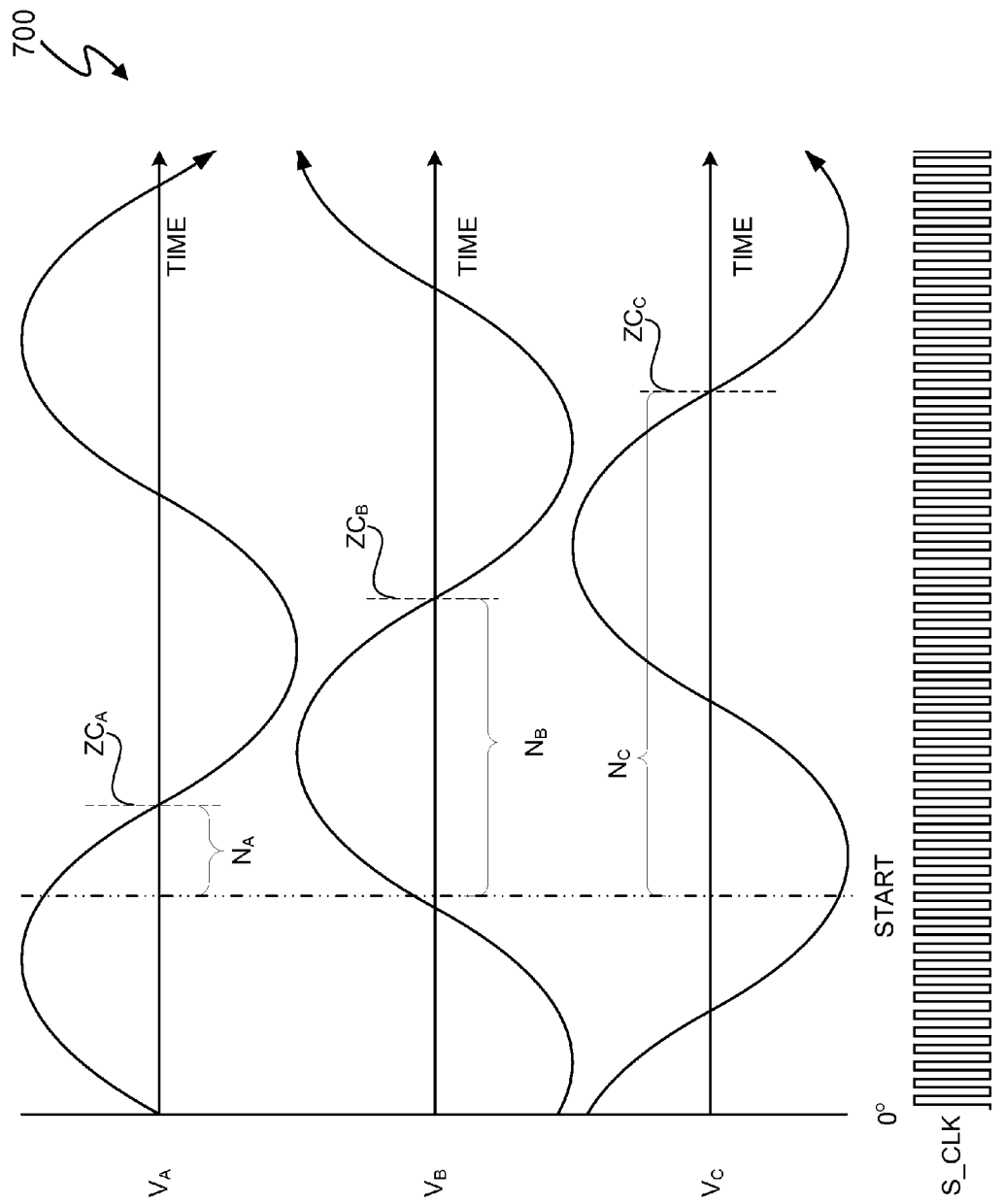
FIG. 7 depicts exemplary waveforms associated with the phase sequence and phase angle detection process of FIG. 6.

FIG. 6 depicts an exemplary phase sequence and phase angle detection process 600. FIG. 7 depicts exemplary waveforms 700 associated with the phase sequence and phase angle detection process 600. Referring to FIGS. 5, 6, and 7, the phase angle data processor 500 receives a single phase voltage $V_X$ through channel 504. The "X" subscripts in FIG. 5 are a generic representation for data processed by the respective phase angle data processors 316, 318, and 320. For example, the clock signal CLK_X represents the clock signal CLK_A for the phase angle data processor 316, the clock signal CLK_X represents the clock signal CLK_B for the phase angle data processor 318, and so on.

The analog-to-digital converter 502 receives the sensed voltage $V_X$, samples the sensed voltage $V_X$ at a sample rate $f_{S\_X}$, and generates samples $V_X(n)$. "$f_{S\_X}$" is a sub-multiple of the frequency of the clock signal CLK_X, and "n" is an integer index for the current sample. The processing block 506 performs, for example, general conditioning of the digital voltage sample $V_X(n)$ such as various filtering functions, as subsequently described, and generates a conditioned digital voltage sample $V_X(n)'$. In operation 602, the phase angle data processor 500 receives a START command from master processor 322 (FIG. 3) or master processor 404 (FIG. 4). Since, in at least one embodiment, all the phase angle data processors 304, 306, and 308 receive the START command concurrently, the phase angle data process 600 begins at the same time for each of the phase angle data processors 304, 306, and 308. The START command initiates operation 604 to begin determination of phase sequence and phase angle data by the phase angle data processor 500, which occurs concurrently in the phase angle data processors 316, 318, and 320 (FIGS. 3 and 4). The digital comparator 508 determines a positive-to-negative transition of the voltage sample $V_X(n)'$ at a zero crossing of the voltage sample $V_X(n)'$ by comparing the voltage sample $V_X(n)'$ with 0. When the voltage sample $V_X(n)'$ falls below 0, the zero crossing value $ZC_X$ at the output of the comparator 508 transitions from a logical one to a logical 0 to indicate a positive-to-negative transition zero crossing such as the zero crossings $ZC_A$, $ZC_B$, and $ZC_C$ in FIG. 7. The comparator 508 is conceptual, and any digital technique can be used to determine when the voltage sample $V_X(n)'$ reaches a zero crossing.

The sample counter 510 begins counting the number of voltage samples $V_X(n)'$ that occur from receipt of the START command until the zero crossing value $ZC_X$ indicates a positive-to-negative transition zero crossing. The sample counter 510 generates a sample count value $N_X$ that indicates the number of samples of voltage $V_X$ received by the phase angle data processor 500 from receipt of the START command until the positive-to-negative zero crossing $ZC_X$ occurred. In FIG. 7, $N_A$ represents the number of samples of phase A voltage $V_A$ from receipt of the START command, $N_B$ represents the number of samples of phase B voltage $V_B$ from receipt of the START command, and $N_C$ represents the number of samples of phase C voltage $V_C$ from receipt of the START command.

Figure 8:
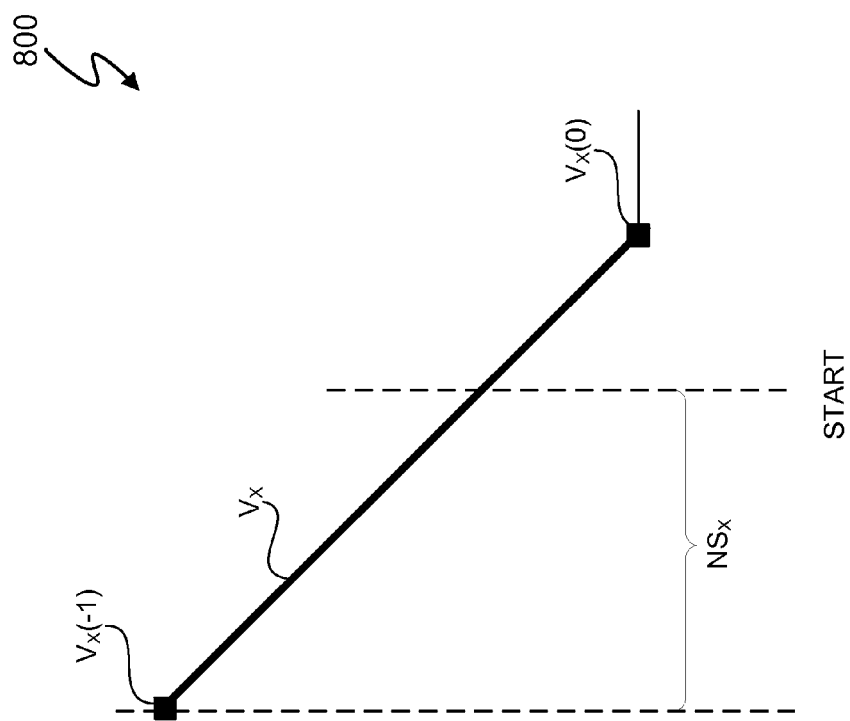
FIG. 8 depicts an exemplary intra-sample START command.

In at least one embodiment, the START command is not synchronized with the clock signals CLK_A, CLK_B, or CLK_C, and the clock signals CLK_A, CLK_B, or CLK_C are not synchronized with each other, i.e. the clock signals CLK_A, CLK_B, or CLK_C are asynchronous and can have different respective frequencies $f_{S\_A}$, $f_{S\_B}$, and $f_{S\_C}$. Circuits, such as the analog-to-digital converter 502 and the intra-sample counter 512, receive the clock signal CLK_X and may derive a separate sampling clock signal from the clock signal CLK_X that may have a higher or lower frequency. Thus, the START command may be received between pulses of any of the clock signals CLK_A, CLK_B, or CLK_C and between any sampling clock signals that are derived from the clock signals CLK_A, CLK_B, or CLK_C. FIG. 8 depicts an exemplary intra-sample START command 800. In at least one embodiment, the accuracy of the phase angle data depends on an accurate determination of the representation of time between when the START command is received and when the positive-to-negative zero crossing occurs. In at least one embodiment, the accuracy of the phase angle data depends on an accurate determination of the representation of time within a sample period that the START command is received. One way to increase the accuracy is to increase the sample rate frequency $f_{S\_X}$. However, increasing the sample rate frequency $f_{S\_X}$ generally increases the cost of the IPDCs 304, 306, and 308. To maintain a lower sample rate frequency $f_{S\_X}$, the intra-sample counter 512 receives the START command, the clock signal CLK_X, and a clock signal CLK_X·M to generate an intra-sample count value $NS_X$. "M" is a multiplier, and the particular value of M is a matter of design choice. Increasing the value of M increases the accuracy of the intra-sample count value $NS_X$ in representing the time between the last voltage sample $V_X(-1)$ before the first voltage sample $V_X(0)$ that occurs after the START command M is, for example $\frac{1}{128}$. In at least one embodiment, the intra-sample counter 512 restarts the value of intra-sample count value $NS_X$ at each pulse of a sampling clock signal derived from the clock signal CLK_X. When the intra-sample counter 512 receives the START command, the intra-sample counter 512 generates the intra-sample count value $NS_X$. Thus, the intra-sample counter 512 compensates for elapsed time that occurs between receipt of the START command and the next sample $V_X(0)$ of the voltage $V_X$.

The phase angle data processor 500 includes registers 514 that stores the values of $V_X(n)$. When the zero crossing value $ZC_X$ indicates a positive-to-negative zero crossing, the registers 514 provide the values of ZCD_OLD and ZCD_NEW to the interpolator 516. The interpolator compensates for elapsed time between the last sample of the voltage $V_X(n)$ and the zero crossing $ZC_X$.

Figure 9:
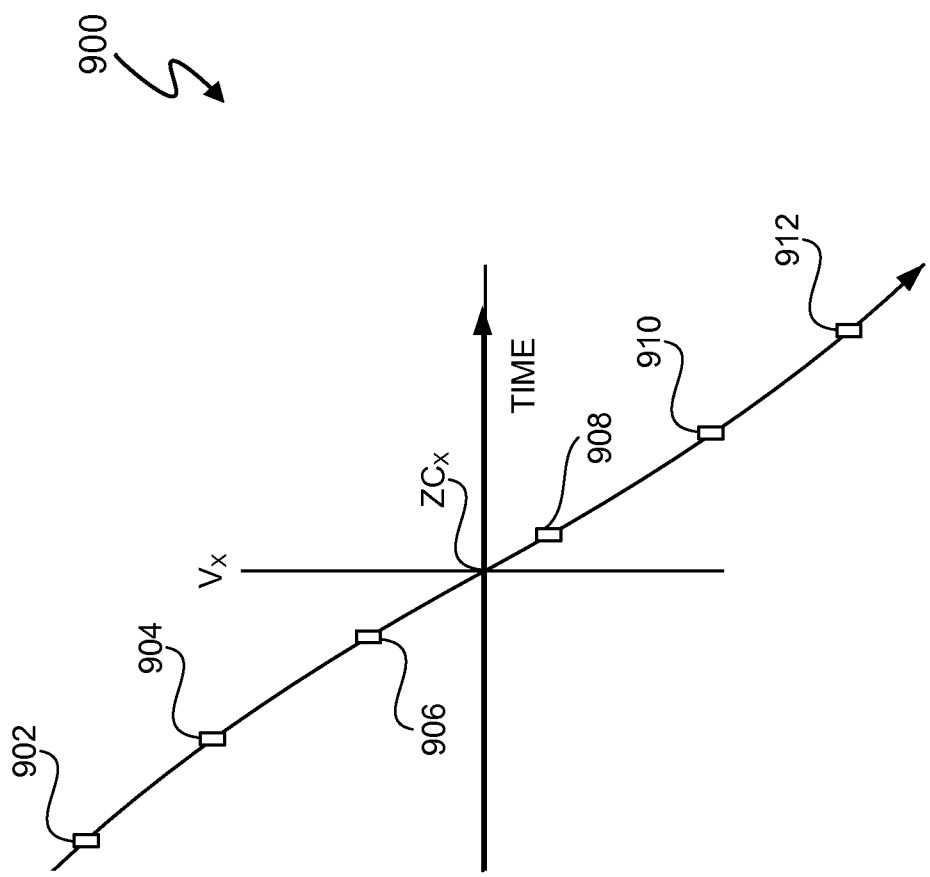
FIG. 9 depicts exemplary voltage samples before and after a zero crossing of the voltage.

FIG. 9 depicts exemplary voltage samples of the voltage $V_X$ before and after a zero crossing. More specifically, FIG.

Figure 10:
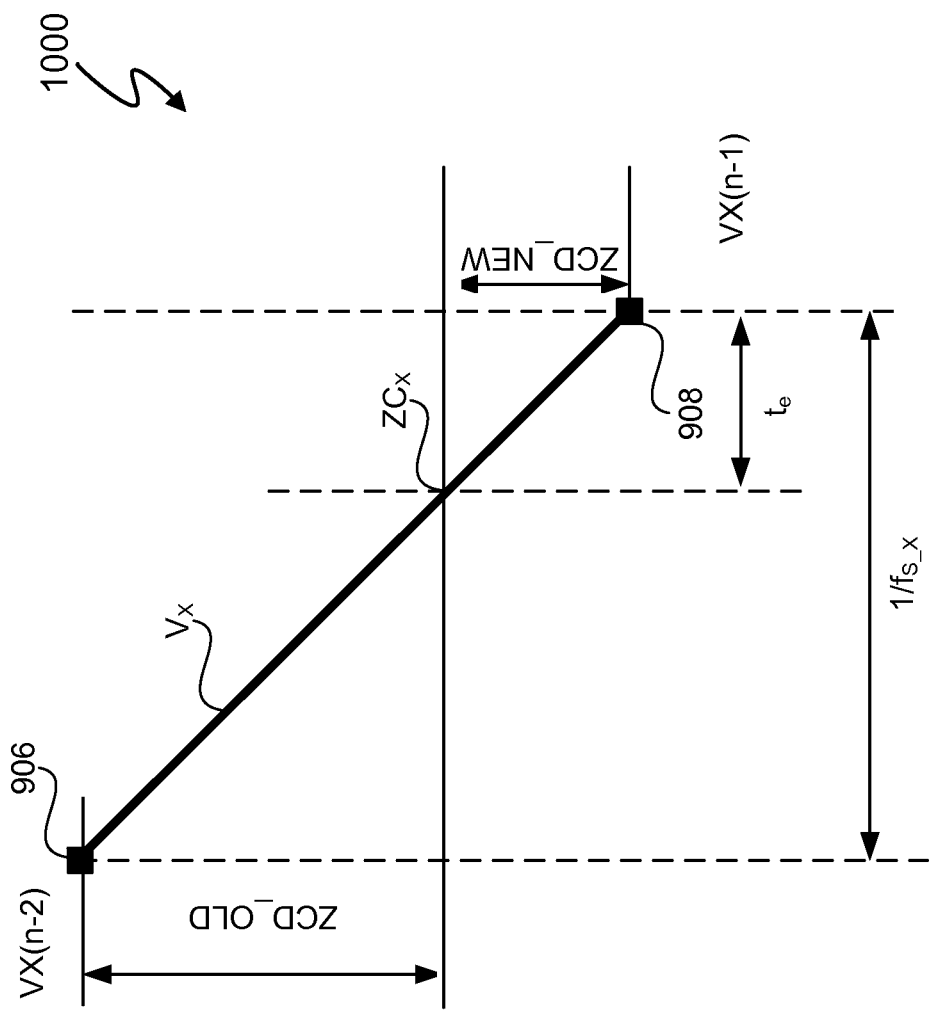
FIG. 10 depicts a zoomed view of a voltage near a zero crossing of the voltage.

9 depicts exemplary pre-zero crossing samples 902, 904, and 906 of the voltage $V_X$ as the voltage $V_X$ approaches the zero crossing $ZC_X$ and post-zero crossing samples 908, 910, and 912 of the voltage $V_X$ immediately after the voltage $V_X$ passed through the zero crossing $ZC_X$. FIG. 10 depicts a zoomed view 1000 of the voltage $V_X$ from the pre-zero crossing sample 906 to the post zero crossing sample 908. The values of ZCD_OLD and ZCD_NEW respectively represent the values of the voltage $V_X$ at respective samples 906 and 908. In at least one embodiment, the sample rate frequency $f_{S\_X}$ is fast enough that the voltage $V_X$ between samples 906 and 908 is approximately linear. Accordingly, the time $t_{e\_X}$ between the zero crossing $ZC_X$ and the sample 908 is given by Equation 1:

$$t_{e\_X} = \frac{|ZCD\_NEW|}{|ZCD\_NEW| + |ZCD\_OLD|} \quad \text{Equation 1}$$

In at least one embodiment, rather than measuring the fundamental line frequency $f_L$ of the voltage $V_X$ and the sample rate frequency $f_{S\_X}$, the phase angle data processor 500 determines a ratio, referred to as epsilon "$\epsilon$", of the line frequency $f_L$ to the sample rate frequency $f_{S\_X}$ as given by Equation 2:

$$\varepsilon_X = \frac{f_L}{f_{S\_X}} \quad \text{Equation 2}$$

To generate $\epsilon_X$, the epsilon generator 518 receives the positive-to-negative or, in another embodiment, a negative-to-positive, zero crossing value $ZC_X$ and the clock signal CLK_X and determines the number of pulses of the clock signal CLK_X that occur between two positive-to-negative zero crossing value $ZC_X$ indications. The two positive-to-negative zero crossing value $ZC_X$ indications represent one cycle of the line frequency $f_L$, and, thus, a ratio of the number of samples in one cycle can be used to compute $\epsilon$.

Referring to FIG. 6, as each of the phase angle data processors 316, 318, and 320 reach a positive-to-negative transition zero crossing of respective voltages $V_A$, $V_B$, and $V_C$, operations 606, 608, and 610 transition from NO to YES, and, in operation 612 provide their respective values of $NS_X$, $t_{e\_X}$, $\epsilon_X$, and $N_X$ to the master processor 322 (FIG. 3) or the master processor 404 (FIG. 4). In operation 614, the master processor 322 (FIG. 3) or the master processor 404 (FIG. 4) determines the phase angle deltas between at least two sets of the voltages $V_A$, $V_B$, and $V_C$.

Figure 11:
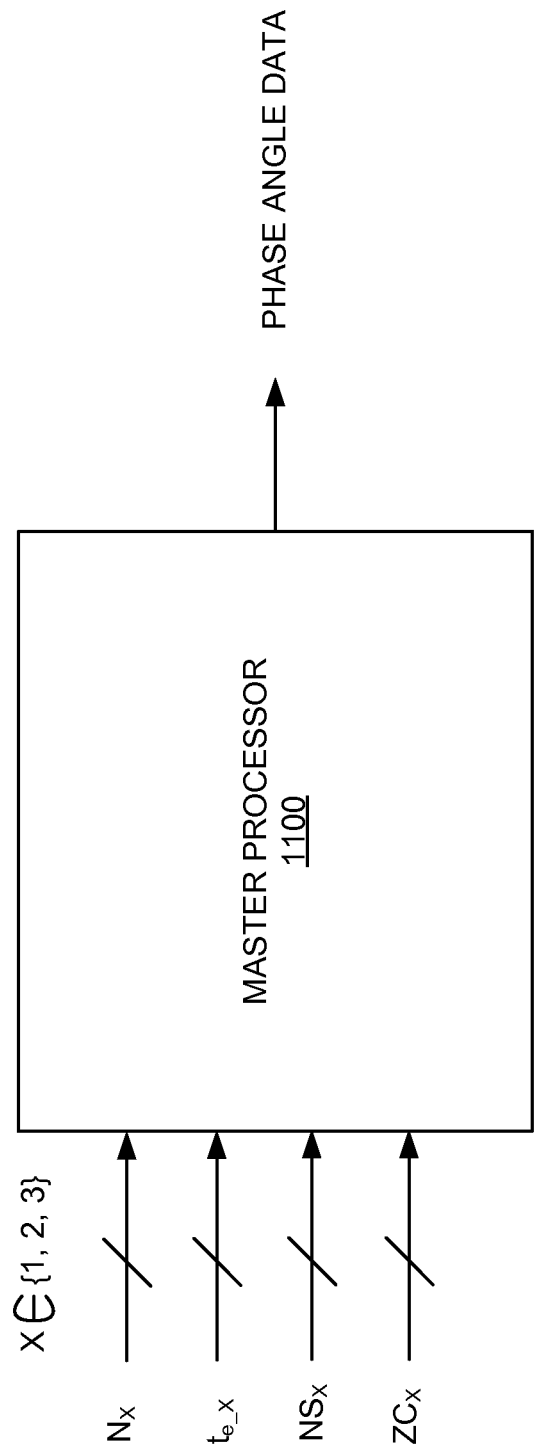
FIG. 11 depicts an exemplary master processor of the power measurement systems of FIGS. 3 and 4.

FIG. 11 depicts master processor 1100, which represents one embodiment of the master processor 322 (FIG. 3) or the master processor 404 (FIG. 4). The master processor 1100 receives the respective values of $NS_X$, $t_{e\_X}$, $\epsilon_X$, and $N_X$ from each of the IPDCs 304, 306, and 308. The master processor 1100 determines the sequence of the phases from the order of the values of the sample count value $N_X$ from smallest to largest. As shown in exemplary waveforms 700, $N_A$ is smallest for the phase A voltage $V_A$ and largest for the phase C voltage $V_C$. Thus, the phase sequence is $V_A$, $V_B$, $V_C$.

The master processor 1100 then determines angles $ANGLE_A$, $ANGLE_B$, and $ANGLE_C$ of each of the three phase voltages $V_A$, $V_B$, and $V_C$ from the START command to the respective positive-to-negative zero crossings $ZC_A$, $ZC_B$, and $ZC_C$. In at least one embodiment, the master processor 1100 determines the value of each of the angles $ANGLE_A$, $ANGLE_B$, and $ANGLE_C$ in accordance with:

$$ANGLE_X = \left\{\left[N_X - 1 - t_{e\_X} - \frac{N_{SX}}{M} - \{PCD\}\right] \cdot \epsilon_X \cdot 360\right\} - \{PD\} \quad \text{Equation 3}$$

($N_X$–1) represents the number of samples of the voltage $V_X(n)$ from the START command to the positive-to-negative transition zero crossing $ZC_X$. "$N_X$–1" is used rather than "$N_X$" because, in at least one embodiment, the last sample $V_X(N_X)'$ actually occurs immediately after the positive-to-negative transition zero crossing $ZC_X$ i.e. the zero crossing occurs in the same sample interval as the START command. $t_{e\_X}$ represents the interpolated time in terms of a fraction of a cycle of the clock signal CLK_X (or a fraction of a sampling clock signal derived from the clock signal CLK_X) between the last sample of the voltage $V_X(n)'$ and the positive-to-negative transition zero crossing $ZC_X$ as set forth in Equation 1. $NS_X/M$ represents the fraction of a cycle of the clock signal CLK_X between the sample $V_X(-1)$ immediately preceding the START command and the first sample $V_X(0)$. $\epsilon_X$ equals the ratio of the line frequency $f_L$ to the sample rate frequency $f_{SX}$ as set forth in Equation 2. PCD represents a phase compensation delay. The value of the PCD compensates for delays in the phase of the voltage $V_X$ due to, for example, parasitic impedances. In at least one embodiment, the PCD represents one or two cycles of the clock signal CLK_X or a sampling clock signal internally derived from the clock signal CLK_X by the analog-to-digital converter 502. The quantity $$\left[N_X - 1 - t_{e\_X} - \frac{N_{SX}}{M} - \{PCD\}\right] \cdot \epsilon_X$$

is multiplied by 360, which represents the number of degrees in a full cycle of the voltage $V_X$ to give an angular fraction of the voltage $V_X$ that occurs between START command and the positive-to-negative transition zero crossing $ZC_X$ plus a processing delay PD. The processing delay PD represents the processing delay of the processing block 506. In at least one embodiment, the processing delay PD is determined in terms of $\epsilon$ as subsequently described with reference to FIG. 12. The master processor 1100 provides the determined phase angle data as the PHASE ANGLE DATA output.

Figure 12:
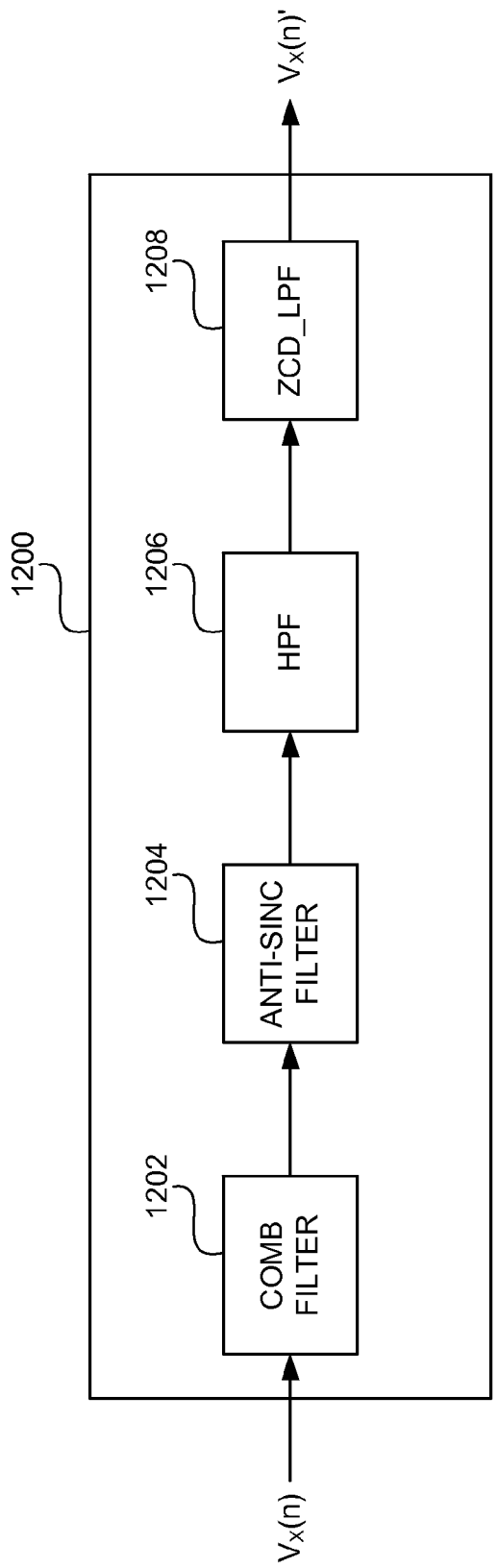
FIG. 12 depicts a signal conditioning processing block.

FIG. 12 depicts signal conditioning processing block 1200, which represents one embodiment of processing block 506. Processing block 1200 contains four successive well-known digital filter types to condition the digital voltage signal $V_X(n)$. The particular filter types are a matter of design choice and, in at least one embodiment, are comb filter 1202, anti-sinc filter 1204, high pass filter 1206, and zero-cross detection low pass filter 1208. The individual and aggregate processing delays attributable to the filters can be determined, for example, empirically or mathematically. In at least one embodiment, Equation 3 represents the processing delay PD due to the individual filters in the processing block 1200:

PD=COMB$_{DELAY}$–ANTISINC$_{DELAY}$–HPF$_{DELAY}$+ ZCD_LPF$_{DELAY}$

COMB$_{DELAY}$=539.4745·$\epsilon$–0.0085

ANTISINC$_{DELAY}$=113.2172·$\epsilon$–0.0219

$$\text{HPF}_{DELAY} = -28.006 \cdot \epsilon - 0.7064$$

$$\text{ZCD\_LPF}_{DELAY} = 2051.8 \cdot \epsilon + 6.8$$

The values of the $\text{COMB}_{DELAY}$, $\text{ANTISINC}_{DELAY}$, $\text{HPF}_{DELAY}$, and $\text{ZCD\_LPF}_{DELAY}$ are exemplary and depend upon the particular implementation of the filters. In at least one embodiment, the processing delay PD can change with changes in the input line frequency as well as with changes to the clock signal CLK_X. Since $\epsilon$ is a ratio of the sample rate frequency $f_{S\_X}$ and the line frequency $f_L$, $\epsilon$ maps an "error" in the clock signal CLK_X to an error in the line frequency $f_L$ and, thus, the foregoing estimates of the processing delay account for changes in the input line frequency as well as with changes to the clock signal CLK_X.

Operation 614 then determines the phase angle deltas by subtracting the phase angles for each voltage $V_A$, $V_B$, and $V_C$ from each other in accordance with the phase sequence so that, in at least one embodiment, a trailing phase voltage is subtracted from a leading edge voltage. For example, in the embodiment of FIG. 7, voltage $V_A$ leads voltage $V_B$, and voltage $V_B$ leads voltage $V_C$. So the master processor 322 (FIG. 3) and the master processor 404 (FIG. 4) determine the DELTA ANGLE$_{AB}$=ANGLE$_A$−ANGLE$_B$, DELTA ANGLE$_{AC}$=ANGLE$_A$−ANGLE$_C$, and DELTA ANGLE$_{BC}$=ANGLE$_B$−ANGLE$_C$. Experimental results indicate that the power measurement systems 302 (FIGS. 3) and 402 (FIG. 4) can achieve delta angle accuracies with an error of 0.1% or less.

Figure 13:
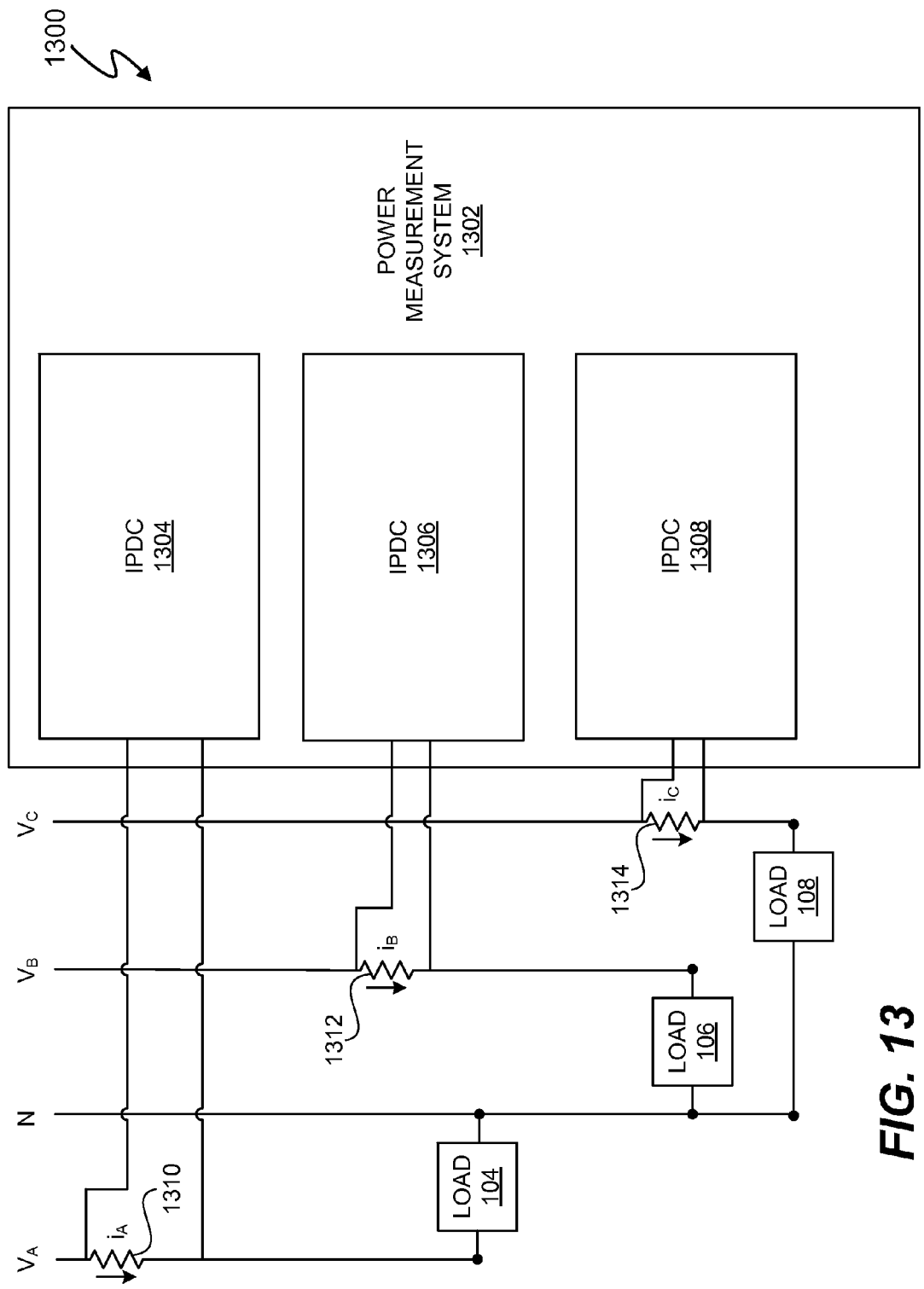
FIG. 13 depicts a power distribution system using shunt resistor sampling.

FIG. 13 depicts a power distribution system 1300 using shunt resistor sampling of the currents $i_A$, $i_B$, and $i_C$ in the three phase power system. The power measurement system 1302 can be configured in the same way as, for example, the power measurement system 302 (FIG. 3) or the power measurement system 402 with asynchronous, isolated IPDCs 1304, 1306, and 1308. The IPDCs 1304, 1306, and 1308 sample respective voltages across shunt resistors 1310, 1312, and 1314, which represent currents $i_A$, $i_B$, and $i_C$. The power measurement system 1302 then determines the phase angle differences as discussed, for example, in connection with the phase angle data processor 500 (FIG. 5).

Figure 14:
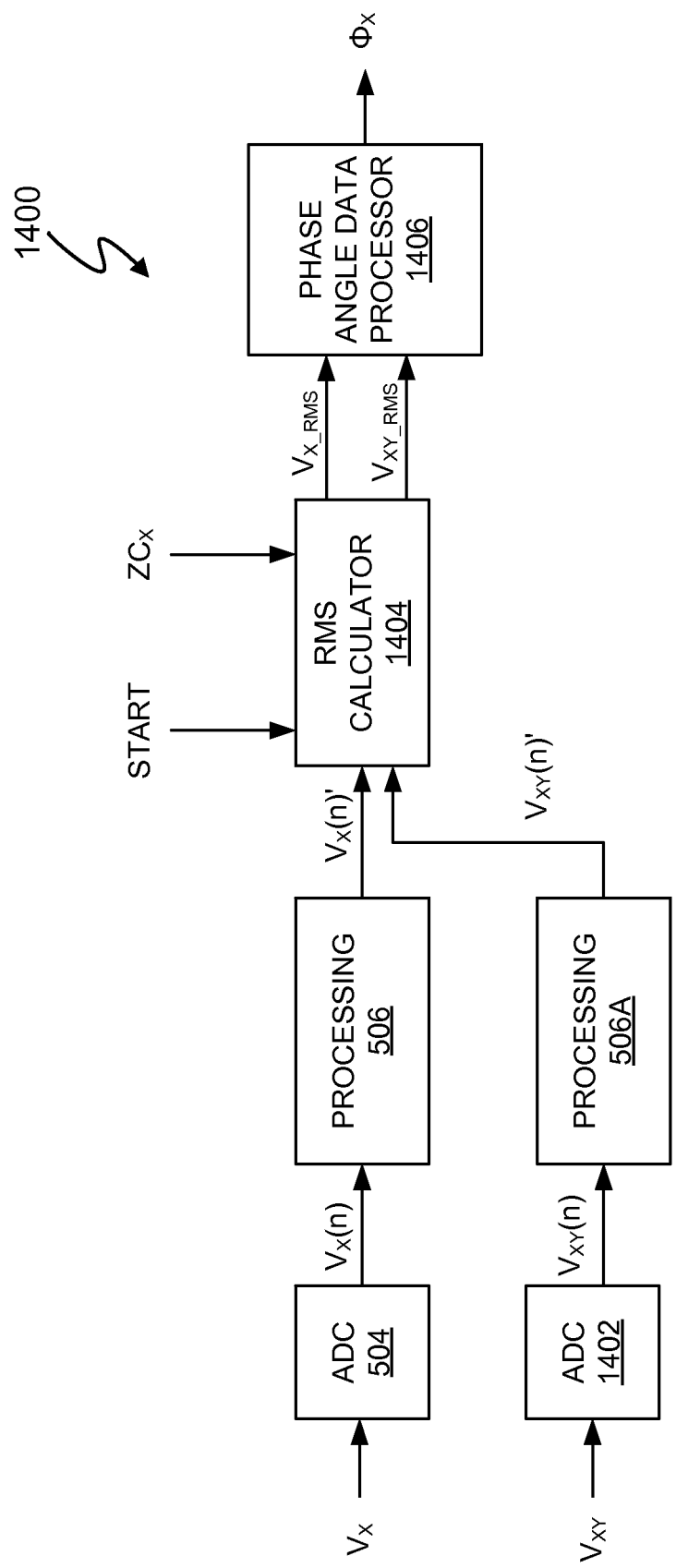
FIG. 14 depicts a law of cosines based phase angle data processor.

FIG. 14 depicts a law of cosines based phase angle data processor 1400, which represents one embodiment of each of the phase angle data processors 316, 318, and 320. The phase angle data processor 1400 utilizes the law of cosines to determine the phase angle deltas between the phases of voltages $V_A$, $V_B$, and $V_C$ from FIGS. 3 and 4. In addition to sampling the voltage $V_X$ with analog-to-digital converter 504 and conditioning with processing block 506, analog-to-digital converter 1402 also samples voltage $V_{XY}$. Voltage $V_{XY}$ represents a voltage between any two of the voltages $V_A$, $V_B$, and $V_C$, such as $V_{AB}$, $V_{AC}$, and $V_{BC}$. In at least one embodiment, the processing block 506A is identical to the processing block 506 and generates a conditioned output voltage $V_{XY}(n)'$. The root mean square (RMS) calculator 1404 determines the root mean squares of the voltages $V_X(n)'$ and $V_{XY}(n)'$ for at least one period of the voltages as indicated by successive positive-to-negative or negative-to-positive zero crossings $ZC_X$. The phase angle data processor 1406 then utilizes the law of cosines to determine at least two of the delta phase angles between phases A, B, and C of the respective voltages $V_A$, $V_B$, and $V_C$.

Figure 15:
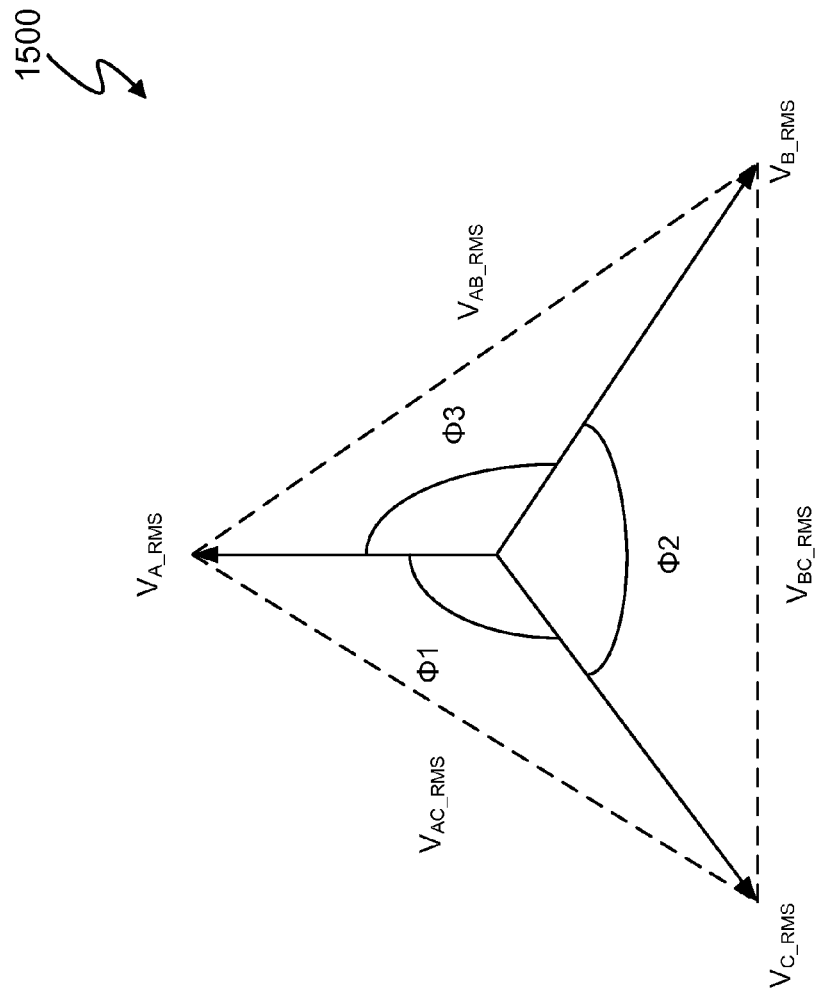
FIG. 15 depicts a conceptual three-phase relationship root mean square voltages of three voltages.

FIG. 15 depicts a conceptual three-phase relationship 1500 between the RMS voltage values of $V_{A\_RMS}$, $V_{B\_RMS}$, and $V_{C\_RMS}$ of respective voltages $V_A$, $V_B$, and $V_C$. The angles Φ1, Φ2, and Φ3 represent the respective angles between the RMS voltage values of $V_{A\_RMS}$, $V_{B\_RMS}$, and $V_{C\_RMS}$.

Referring to FIGS. 14 and 15, the phase angle data processor 1400 calculates two of the phase angles Φ1, Φ2, and Φ3 in accordance with Equation 4:

$$\Phi_Z = \cos^{-1}\left(\frac{V_X^2 + V_Y^2 - V_{XY}^2}{2 \cdot V_X \cdot V_Y}\right) \quad \text{Equation 4}$$

ΦZ represents any of Φ1, Φ2, and Φ3. For the calculation of Φ1, $V_X$ represents the voltage $V_{A\_RMS}$, voltage $V_Y$ represents the voltage $V_{C\_RMS}$, and $V_{XY}$ represents the voltage $V_{AC\_RMS}$. For the calculation of Φ2, $V_X$ represents the voltage $V_{CRMS}$, voltage $V_Y$ represents the voltage $V_{B\_RMS}$, and $V_{XY}$ represents the voltage $V_{BC\_RMS}$. The sum of the angles Φ1, Φ2, and Φ3 equal 360°, so calculation of two angles in accordance with Equation 4 allows the master processor 322 (FIG. 3) or master processor 404 (FIG. 4) to calculate the third angle by subtracting the two calculated angles from 360 or by calculating the third angle and verifying that all three angles add to 360.

Thus, system and method utilize multiple, asynchronous, voltage isolated IPDCs to respectively determine one or more power parameters of a multi-phase power distribution system, such as differences between voltage phases of a multi-phase power distribution system.

Although embodiments have been described in detail, it should be understood that various changes, substitutions, and alterations can be made hereto without departing from the spirit and scope of the invention as defined by the appended claims. For example, the foregoing technique of using isolated, asynchronous circuits do determine the phase angle parameters of a three phase power distribution system utilizing a common START command can also be applied to determination of other parameters by the isolated, asynchronous circuits.

What is claimed is:

1. A method of operating multiple, asynchronous, voltage isolated integrated power data circuits to acquire and process data for a three-phase power distribution system, the method comprising:
    providing a master processor in the three phase-power distribution system to operate the multiple, asynchronous, voltage isolated integrated power data circuits;
    providing a common start command, from the master processor and distinct from one or more clock signals, to the multiple, asynchronous, voltage isolated integrated power data circuits to initiate concurrent data acquisition by the multiple, asynchronous, voltage isolated integrated power data circuits to obtain respective data for respective voltages of the three-phase power distribution system to provide data distinct from the data obtained to allow determination of one or more power parameters for the voltages in the three-phase voltage distribution system;
    providing the data to the master processor;
    determining values of the one or more power parameters with the master processor; and
    providing access to the values of the one or more power parameters determined with the master processor for phase sequence detection and phase angle detection in the three-phase power distribution system.

2. The method of claim 1 wherein determining the one or more power parameters with the processor comprises determining a phase sequence of the voltages and phase angle deltas between at least two sets of the voltages.

3. The method of claim 1 wherein one of the integrated power data circuits includes the processor for determining the one or more power parameters with the processor.

4. The method of claim 1 wherein a voltage on each of the respective voltage lines is greater than a supply voltage to the multiple integrated power data circuits.

5. The method of claim 1 wherein each of the multiple, asynchronous, voltage isolated integrated power data circuits includes a phase angle data processor, the method further comprising:
clocking each of the integrated power data circuits with respective asynchronous clock signals.

6. The method of claim 1 wherein each of the multiple, asynchronous, voltage isolated integrated power data circuits include respective input channels that are electrically isolated from each other.

7. The method of claim 1 further comprising:
determining an occurrence of a common event after initiation of the concurrent data acquisition in each of the voltages in the three-phase voltage distribution system; and
determining a difference in phases between the voltages based on elapsed time between receiving the start command and the common event.

8. The method of claim 7 wherein the common event is one of a positive-to-negative zero crossing of each of the voltages or a negative-to-positive zero crossing of each of the voltages.

9. The method of claim 7 further comprising:
compensating for intra-sample timing differences between samples of the voltages and receipt of the start command and samples of the voltages and occurrence of the common event.

10. The method of claim 1 wherein determining the one or more power parameters with the processor comprises:
determining root mean square values of the voltages and differences between the voltages; and
processing the root means square voltages using a law of cosines to determine phase angles between the voltages.

11. An apparatus comprising:
a power measurement system that includes a master processor that operates multiple, asynchronous, voltage isolated integrated power data circuits to acquire and process data for a three-phase power distribution system, wherein the master processor of the power measurement system is configured to:
provide a common start command, distinct from one or more clock signals, to the multiple, asynchronous, voltage isolated integrated power data circuits to initiate concurrent data acquisition by the multiple, asynchronous, voltage isolated integrated power data circuits to obtain respective data for respective voltages of the three-phase power distribution system to provide data distinct from the data obtained to allow determination of one or more power parameters for the voltages in the three-phase voltage distribution system;
determine values of the one or more power parameters with the master processor; and
provide access to the values of the one or more power parameters determined with the master processor for phase sequence detection and phase angle detection in the three-phase power distribution system.

12. The apparatus of claim 11 wherein to determine the one or more power parameters with the processor comprises to determine a phase sequence of the voltages and phase angle deltas between at least two sets of the voltages.

13. The apparatus of claim 11 wherein one of the integrated power data circuits includes the processor for determining the one or more power parameters with the processor.

14. The apparatus of claim 11 wherein a voltage on each of the respective voltage lines is greater than a supply voltage to the multiple, asynchronous, voltage isolated integrated power data circuits.

15. The apparatus of claim 11 wherein each of the multiple, asynchronous, voltage isolated integrated power data circuits includes a phase angle data processor, the power measurement system is further configured to:
clock each of the integrated power data circuits with respective asynchronous clock signals.

16. The apparatus of claim 11 wherein each of the multiple, asynchronous, voltage isolated integrated power data circuits include respective input channels that are electrically isolated from each other.

17. The apparatus of claim 11 wherein the power measurement system is further configured to:
determine an occurrence of a common event after initiation of the concurrent data acquisition in each of the voltages in the three-phase voltage distribution system; and
determine a difference in phases between the voltages based on elapsed time between receiving the start command and the common event.

18. The apparatus of claim 17 wherein the common event is one of a positive-to-negative zero crossing of each of the voltages or a negative-to-positive zero crossing of each of the voltages.

19. The apparatus of claim 17 wherein the power measurement system is further configured to:
compensate for intra-sample timing differences between samples of the voltages and receipt of the start command and samples of the voltages and occurrence of the common event.

20. The apparatus of claim 11 wherein to determine the one or more power parameters with the processor comprises:
to determine root mean square values of the voltages and differences between the voltages; and
to process the root means square voltages using a law of cosines to determine phase angles between the voltages.

21. A power measurement system that operates multiple, asynchronous, voltage isolated integrated power data circuits to acquire and process data for a three-phase power distribution system, the power measurement system comprising:
means for initiating concurrent data acquisition by the multiple, asynchronous, voltage isolated integrated power data circuits to obtain respective data for respective voltages of a three-phase power distribution system to determine one or more power parameters for the voltages in the three-phase voltage distribution system, wherein the means for initiating concurrent data acquisition comprises:
means for providing a common start command, distinct from one or more clock signals, to the multiple, asynchronous, voltage isolated integrated power data circuits to initiate concurrent data acquisition by the multiple, asynchronous, voltage isolated integrated power data circuits to obtain respective data for the respective voltages in the three-phase power distribution system to provide data distinct from the data obtained to allow determination of one or more power parameters for the voltages in the three-phase voltage distribution system;
means for determining values of the one or more power parameters; and
means for providing access to the values of the one or more power parameters determined for phase sequence detection and phase angle detection in the three-phase power distribution system.

* * * * *